(12) United States Patent
Chaudhary et al.

(10) Patent No.: US 11,455,715 B2
(45) Date of Patent: Sep. 27, 2022

(54) EPITAXY METROLOGY IN FIN FIELD EFFECT TRANSISTORS

(71) Applicant: Applied Materials Israel Ltd., Rehovot (IL)

(72) Inventors: Jitendra Pradipkumar Chaudhary, Bangalore (IN); Roman Kris, Jerusalem (IL); Ran Alkoken, Tel Aviv (IL); Sahar Levin, Or-Yehuda (IL); Chih-Chieh Chang, Hsinchu (TW); Einat Frishman, Rehovot (IL)

(73) Assignee: APPLIED MATERIALS ISRAEL LTD., Rehovot (IL)

(*) Notice: Subject to any disclaimer, the term of this patent is extended or adjusted under 35 U.S.C. 154(b) by 0 days.

(21) Appl. No.: 17/177,119

(22) Filed: Feb. 16, 2021

(65) Prior Publication Data
US 2022/0261979 A1   Aug. 18, 2022

(51) Int. Cl.
*G06T 7/12* (2017.01)
*G06T 7/00* (2017.01)
*H01L 29/66* (2006.01)
*G06T 7/13* (2017.01)

(52) U.S. Cl.
CPC .......... *G06T 7/0004* (2013.01); *G06T 7/12* (2017.01); *G06T 7/13* (2017.01); *H01L 29/66795* (2013.01); *G06T 2207/10061* (2013.01); *G06T 2207/30148* (2013.01)

(58) Field of Classification Search
CPC .......... G06T 7/0004; G06T 7/12; G06T 7/13; G06T 2207/10061; G06T 2207/30148; H01L 29/66795
USPC ....... 382/145, 100, 144, 151, 168, 169, 171, 382/172, 173, 181, 190, 199, 237, 255, 382/266, 274
See application file for complete search history.

(56) References Cited

U.S. PATENT DOCUMENTS

| | | | |
|---|---|---|---|
| 9,165,376 B2 | 10/2015 | Schwartzband et al. | |
| 10,499,876 B2 * | 12/2019 | Ferng | ........................ H01L 27/10 |
| 2015/0228671 A1 * | 8/2015 | Adam | .................. H01L 29/6681 257/351 |

(Continued)

OTHER PUBLICATIONS

Schwarzband et al. "Roughness Metrology of Gate All Around Silicon Nano Wire Devices." Proc. of SPIE vol. vol. 8324, 2012, 15 pages.

(Continued)

*Primary Examiner* — Sheela C Chawan
(74) *Attorney, Agent, or Firm* — Lowenstein Sandler LLP

(57) ABSTRACT

There is provided a system and method of performing a measurement with respect to an epitaxy formed in a finFET, the epitaxy being separated with at least one adjacent epitaxy by at least one HK fin. The method comprises obtaining an image of the epitaxy and the at least one HK fin, and a gray level (GL) profile indicative of GL distribution of the image; detecting edges of the at least one HK fin; determining two inflection points of the GL profile within an area of interest in the image; performing a critical dimension (CD) measurement between the two inflection points; determining whether to apply correction to the CD measurement based on a GL ratio indicative of a relative position between the epitaxy and the at least one HK fin; and applying correction to the CD measurement upon the GL ratio meeting a predetermined criterion.

20 Claims, 9 Drawing Sheets

(56) References Cited

U.S. PATENT DOCUMENTS

| | | | | |
|---|---|---|---|---|
| 2016/0211352 | A1* | 7/2016 | Chuang | H01L 29/045 |
| 2016/0268435 | A1* | 9/2016 | Lee | H01L 21/02521 |
| 2017/0125550 | A1* | 5/2017 | Chang | H01L 29/66795 |
| 2017/0141214 | A1* | 5/2017 | Zang | H01L 21/823821 |
| 2019/0362931 | A1* | 11/2019 | Watanabe | H01J 37/10 |
| 2020/0243544 | A1* | 7/2020 | Shih | H01L 27/1104 |

OTHER PUBLICATIONS

"Edge detection methods for finding object boundaries in images," The MathWorks, Inc., https://web.archive.org/web/20201201095209/ https://in.mathworks.com/discovery/edge-detection.html, Dec. 1, 2020, 2 pages.

Weisstein, Eric W., "Legendre Polynomial." From MathWorld—A Wolfram Web Resource, https://web.archive.org/web/20201122194112/ https://mathworld.wolfram.com/LegendrePolynomial.html, Dec. 19, 2020, 4 pages.

* cited by examiner

Determining the at least one HK fin comprises two HK fins respectively separating the epitaxy with two adjacent epitaxies (302)

↓

Identifying the area of interest to be an area between inner edges of the two HK fins (304)

FIG. 3A

Determining the at least one HK fin comprises a single HK fin separating the epitaxy with an adjacent epitaxy (310)

↓

Determining a first inflection point of the GL profile on a fin-less side of the epitaxy (312)

↓

Identifying the area of interest to be an area between the first inflection point and one of the edges of the single HK fin (314)

↓

Determining a second inflection point of the GL profile within the area of interest (316)

FIG. 3B

EPITAXY METROLOGY IN FIN FIELD EFFECT TRANSISTORS

TECHNICAL FIELD

The presently disclosed subject matter relates, in general, to the field of examination of a semiconductor specimen, and more specifically, to metrology examination with respect to an epitaxy in a fin field effect transistor (finFET).

BACKGROUND

Current demands for high density and performance associated with ultra large-scale integration of fabricated devices require submicron features, increased transistor and circuit speeds, and improved reliability. As semiconductor processes progress, pattern dimensions such as line width, and other types of critical dimensions, are continuously shrunken. Such demands require formation of device features with high precision and uniformity, which, in turn, necessitates careful monitoring of the fabrication process, including automated examination of the devices while they are still in the form of semiconductor wafers.

Examination can be provided by using non-destructive examination tools during or after manufacture of the specimen to be examined. Examination generally involves generating certain output (e.g., images, signals, etc.) for a specimen by directing light or electrons to the wafer and detecting the light or electrons from the wafer. A variety of non-destructive examination tools includes, by way of non-limiting example, scanning electron microscopes, atomic force microscopes, optical inspection tools, etc.

Examination processes can include a plurality of examination steps. During the manufacturing process, the examination steps can be performed a multiplicity of times, for example after the manufacturing or processing of certain layers, or the like. Additionally or alternatively, each examination step can be repeated multiple times, for example for different wafer locations, or for the same wafer locations with different examination settings.

Examination processes are used at various steps during semiconductor fabrication to detect and classify defects on specimens, as well as perform metrology related operations. Effectiveness of examination can be increased by automatization of process(es) as, for example, defect detection, Automatic Defect Classification (ADC), Automatic Defect Review (ADR), automated metrology-related operations, etc.

SUMMARY

In accordance with certain aspects of the presently disclosed subject matter, there is provided a computerized system of performing a measurement with respect to an epitaxy formed in a fin field effect transistor (finFET), the epitaxy being separated with at least one adjacent epitaxy by at least one high-k (HK) fin, the system comprising a processing and memory circuitry (PMC) configured to: obtain an image representative of the epitaxy and the at least one HK fin, and a gray level (GL) profile indicative of GL distribution of the image; detect edges of the at least one HK fin on the image based on the GL profile; determine two inflection points of the GL profile within an area of interest in the image at least based on the detected edges of the at least one HK fin, the inflection points being indicative of expected presence of edges of the epitaxy; perform a critical dimension (CD) measurement between the two inflection points; determine whether to apply correction to the CD measurement based on a GL ratio indicative of a relative position of the epitaxy with respect to the at least one HK fin; and apply correction to the CD measurement upon the GL ratio meeting a predetermined criterion.

In addition to the above features, the system according to this aspect of the presently disclosed subject matter can comprise one or more of features (i) to (xi) listed below, in any desired combination or permutation which is technically possible:

(i). The PMC can be further configured to determine the number of HK fins comprised in the at least one HK fin based on the detected edges, and wherein the area of interest is identified based on the determined number of HK fins and the detected edges.

(ii). The at least one HK fin can comprise two HK fins respectively separating the epitaxy with two adjacent epitaxies, and the area of interest is identified to be an area between inner edges of the two HK fins.

(iii). The at least one HK fin can comprise a single HK fin separating the epitaxy with an adjacent epitaxy, and the determining two inflection points can comprise determining a first inflection point of the GL profile on a fin-less side of the epitaxy, identifying the area of interest to be an area between the first inflection point and one of the edges of the single HK fin, and determining a second inflection point of the GL profile within the area of interest.

(iv). The GL ratio can be determined based on a first GL value determined based on one or more pixel values between edges of the at least one HK fin and the epitaxy, and a second GL value determined based on one or more pixel values between the two inflection points.

(v). The at least one HK fin can comprise a first HK fin and a second HK fin respectively separating the epitaxy with a first adjacent epitaxy and a second adjacent epitaxy, and the GL ratio can be determined based on an averaged GL value averaged between a first GL value and a second GL value, and a third GL value, wherein the first GL value is determined based on one or more pixel values between edges of the first HK fin and the first adjacent epitaxy, the second GL value is determined based on one or more pixel values between edges of the second HK fin and the second adjacent epitaxy, and the third GL value is determined based on one or more pixel values between the two inflection points.

(vi). The predetermined criterion can comprise that the GL ratio is within a range defined by a first threshold and a second threshold, indicating the epitaxy has preferential growth on one side with respect to the other side.

(vii). The first threshold and the second threshold can be predetermined according to a correlation parameter indicative of correlation level between corresponding Transmission Electron Microscope (TEM) measurements and Scanning Electron Microscope (SEM) measurements of a reference epitaxy of a reference finFET specimen.

(viii). The correction can be based on an offset parameter predetermined according to an offset between corresponding TEM measurements and SEM measurements of a reference epitaxy of a reference finFET specimen.

(ix). The edges of the at least one HK fin can be detected using an edge detection algorithm selected from a group comprising advanced line analysis, Sobel, Canny, Prewitt, Roberts, and fuzzy logic methods.

(x). The two inflection points can be determined using an edge enhancement algorithm.

(xi). The CD measurement is informative of width of the epitaxy.

In accordance with other aspects of the presently disclosed subject matter, there is provided a method of performing a measurement with respect to an epitaxy formed in a fin field effect transistor (finFET), the epitaxy being separated with at least one adjacent epitaxy by at least one high-k (HK) fin, the method performed by a processing and memory circuitry (PMC), the method comprising: obtaining an image representative of the epitaxy and the at least one HK fin, and a gray level (GL) profile indicative of GL distribution of the image; detecting edges of the at least one HK fin on the image based on the GL profile; determining two inflection points of the GL profile within an area of interest in the image at least based on the detected edges of the at least one HK fin, the inflection points being indicative of expected presence of edges of the epitaxy; performing a critical dimension (CD) measurement between the two inflection points; determining whether to apply correction to the CD measurement based on a GL ratio indicative of a relative position of the epitaxy with respect to the at least one HK fin; and applying correction to the CD measurement upon the GL ratio meeting a predetermined criterion.

This aspect of the disclosed subject matter can comprise one or more of features (i) to (xi) listed above with respect to the system, mutatis mutandis, in any desired combination or permutation which is technically possible.

In accordance with other aspects of the presently disclosed subject matter, there is provided a non-transitory computer readable medium comprising instructions that, when executed by a computer, cause the computer to perform a method of performing a measurement with respect to an epitaxy formed in a fin field effect transistor (finFET), the epitaxy being separated with at least one adjacent epitaxy by at least one high-k (HK) fin, the method comprising: obtaining an image representative of the epitaxy and the at least one HK fin, and a gray level (GL) profile indicative of GL distribution of the image; detecting edges of the at least one HK fin on the image based on the GL profile; determining two inflection points of the GL profile within an area of interest in the image at least based on the detected edges of the at least one HK fin, the inflection points being indicative of expected presence of edges of the epitaxy; performing a critical dimension (CD) measurement between the two inflection points; determining whether to apply correction to the CD measurement based on a GL ratio indicative of a relative position of the epitaxy with respect to the at least one HK fin; and applying correction to the CD measurement upon the GL ratio meeting a predetermined criterion.

This aspect of the disclosed subject matter can comprise one or more of features (i) to (xi) listed above with respect to the system, mutatis mutandis, in any desired combination or permutation which is technically possible.

BRIEF DESCRIPTION OF THE DRAWINGS

In order to understand the disclosure and to see how it may be carried out in practice, embodiments will now be described, by way of non-limiting example only, with reference to the accompanying drawings, in which:

FIGS. 3A and 3B illustrate generalized flowcharts of determining the area of interest and the inflection points of the GL profile in accordance with certain embodiments of the presently disclosed subject matter

DETAILED DESCRIPTION OF EMBODIMENTS

Figure 1:
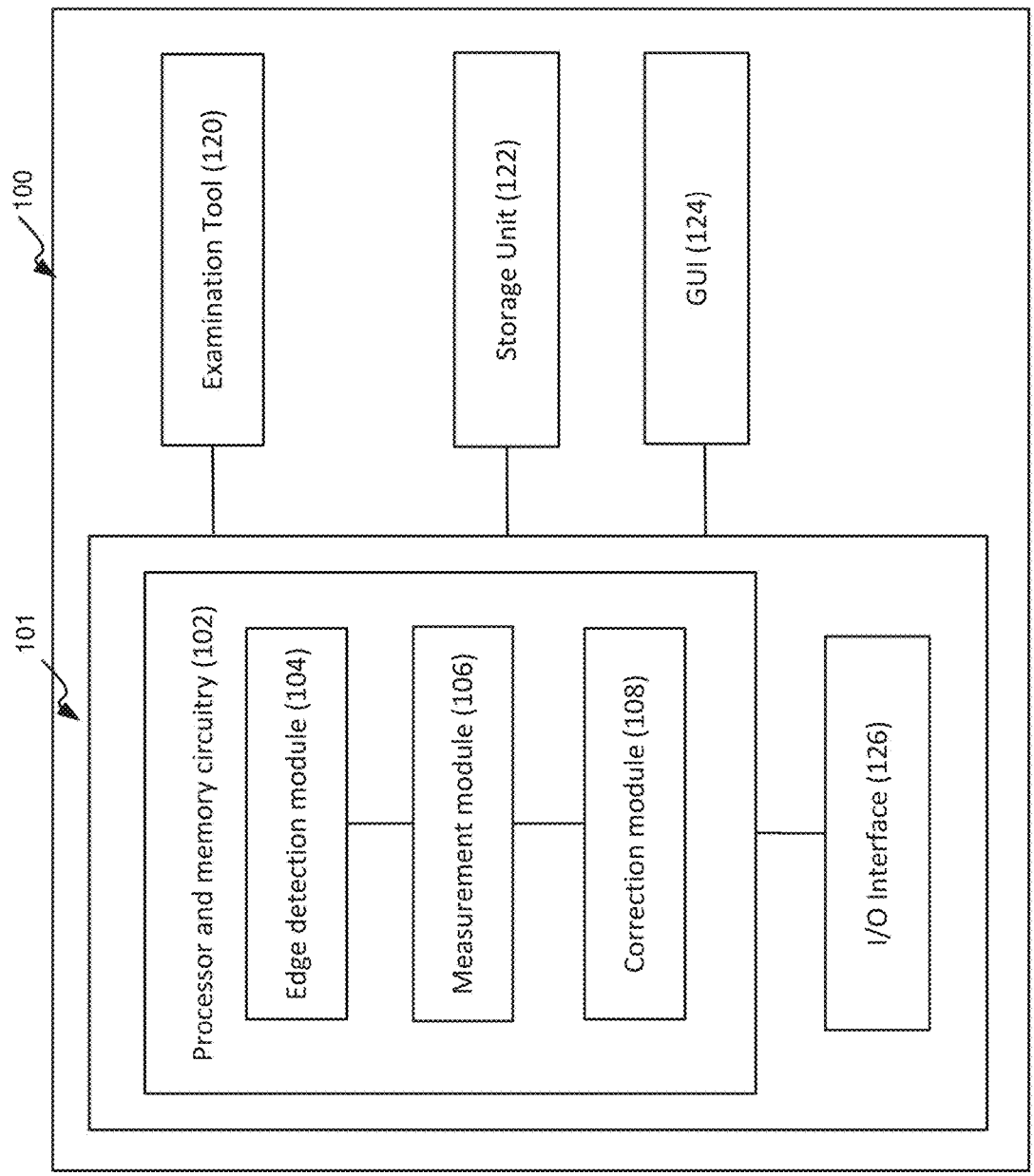
FIG. 1 illustrates a generalized block diagram of an examination system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "performing", "obtaining", "detecting", "determining", "applying", "examining", "identifying", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the examination system, the metrology system and respective parts thereof disclosed in the present application.

The term "examination" used in this specification should be expansively construed to cover any kind of metrology-related operations, as well as operations related to detection and/or classification of defects in a specimen during its fabrication. Examination is provided by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof, using the same or different examination tools. Likewise, examination can be provided prior to manufacture of the specimen to be examined, and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes, atomic force microscopes, optical inspection tools, etc.

The term "metrology" used in this specification should be expansively construed to cover any kind of measuring characteristics and features in a specimen provided by using examination and/or metrology tools during or after manufacture of the specimen to be inspected. By way of non-limiting example, the metrology process can include generating a measurement recipe and/or performing runtime measurement, for example by scanning (in a single or in multiple scans), reviewing, measuring and/or other operations provided with regard to the specimen or parts thereof using the same or different tools. Measurement results such as measured images are analyzed for example, by employing image-processing techniques. Note that, unless specifically stated otherwise, the term "metrology" or derivatives thereof used in this specification are not limited with respect to measurement technology, measurement resolution or size of inspection area.

The terms "non-transitory memory" and "non-transitory storage medium" used herein should be expansively construed to cover any volatile or non-volatile computer memory suitable to the presently disclosed subject matter.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "defect" used in this specification should be expansively construed to cover any kind of abnormality or undesirable feature formed on or within a specimen.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of an examination system in accordance with certain embodiments of the presently disclosed subject matter.

The examination system 100 illustrated in FIG. 1 can be used for examination of a semiconductor specimen (e.g., of a wafer and/or parts thereof) as part of the specimen fabrication process. According to certain embodiments of the presently disclosed subject matter, the illustrated examination system 100 comprises a computer-based system 101 capable of automatically performing one or more metrology operations on images obtained during specimen fabrication (referred to hereinafter as fabrication process (FP) images). System 101 is also referred to as a metrology system, which is a sub-system of the examination system 100. Specifically, one of the metrology operations can include a measurement with respect to a specimen or part thereof, such as, e.g., an epitaxy formed in a fin field effect transistor (finFET).

System 101 can be operatively connected to one or more examination tools 120 configured for examination of a semiconductor specimen. In some embodiments, at least one of the examination tools 120 has metrology capabilities and can be configured to capture FP images and perform metrology operations on the captured images. Such an examination tool is also referred to as a metrology tool.

By way of example, FP images can be selected from images of a specimen (e.g. wafer or parts thereof) captured during the manufacturing process, derivatives of the captured images obtained by various pre-processing stages (e.g. images of a part of a wafer or a photomask captured by a scanning electron microscope (SEM) or an optical inspection system, registered images of different examination modalities corresponding to the same mask location, segmented images, height map images, etc.) and computer-generated design data-based images. It is to be noted that in some cases the images can include image data (e.g., captured images, processed images, etc.) and associated numeric data (e.g., metadata, hand-crafted attributes, etc.). It is further noted that image data can include data related to a layer of interest and/or to one or more other layers of the specimen. For instance, the FP image can include image data of the layer of the epitaxy of the finFET device.

The term "examination tool(s)" used herein should be expansively construed to cover any tools that can be used in examination-related processes, including, by way of non-limiting example, imaging, scanning (in a single or in multiple scans), sampling, reviewing, measuring, classifying and/or other processes provided with regard to the specimen or parts thereof.

By way of example, a specimen can be examined by one or more low-resolution examination tools (e.g., an optical inspection system, low-resolution SEM, etc.). The resulting data (referred to as low-resolution image data), informative of low-resolution images of the specimen, can be transmitted—directly or via one or more intermediate systems—to system 101. Alternatively, or additionally, the specimen can be examined by a high-resolution tool (e.g., a Scanning Electron Microscope (SEM) or Atomic Force Microscopy (AFM) or Transmission Electron Microscope (TEM)). The resulting data (referred to as high-resolution image data), informative of high-resolution images of the specimen, can be transmitted—directly or via one or more intermediate systems—to system 101.

Without limiting the scope of the disclosure in any way, it should also be noted that the examination tools 120 can be implemented as examination machines of various types, such as optical imaging machines, electron beam inspection machines, and so on. In some cases, the same examination tool can provide low-resolution image data and high-resolution image data.

System 101 includes a processor and memory circuitry (PMC) 102 operatively connected to a hardware-based I/O interface 126. PMC 102 is configured to provide processing necessary for operating the system as further detailed with reference to FIGS. 2, 3A and 3B, and comprises a processor (not shown separately) and a memory (not shown separately). The processor of PMC 102 can be configured to execute several functional modules in accordance with computer-readable instructions implemented on a non-transitory computer-readable memory comprised in the PMC. Such functional modules are referred to hereinafter as comprised in the PMC.

As aforementioned, system 101 can be configured to perform a measurement with respect to an epitaxy formed in a fin field effect transistor (finFET). A finFET is a non-planar multi-gate transistor. A fin structure (also referred to as fin) of silicon is first patterned on to the wafer. After forming the fin, a gate stack is deposited and patterned so that the patterned gate material runs perpendicular to the fin. Where the patterned gate material overlaps the fin, a gate for the finFET is formed. A FinFET transistor can contain several fins, arranged side by side and all covered by the same gate, that act electrically as one, to increase drive strength and performance. An epitaxy grows on the fins acting as a stressor and enables higher channel mobility, thereby improving the finFET device performance.

Figure 4A:
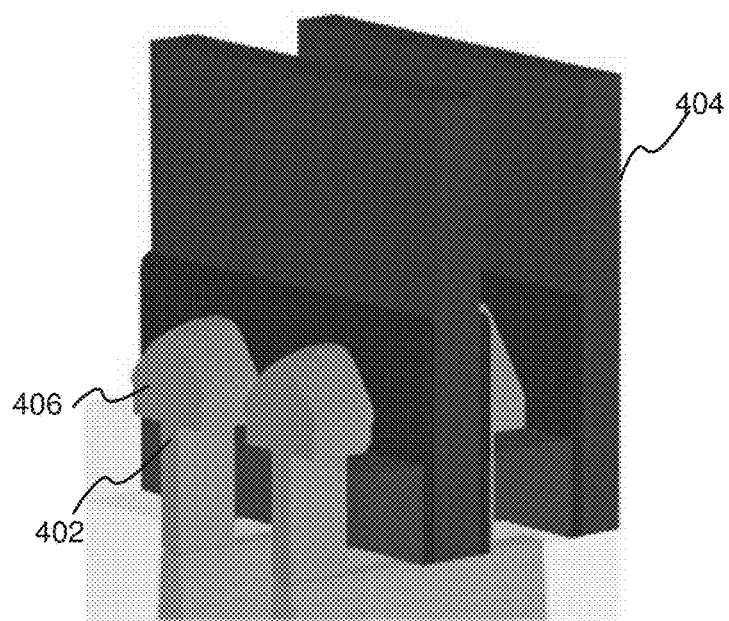
FIG. 4A depicts a 3D illustration of an exemplified finFET device formed on a wafer in accordance with certain embodiments of the presently disclosed subject matter.
Figure 4B:
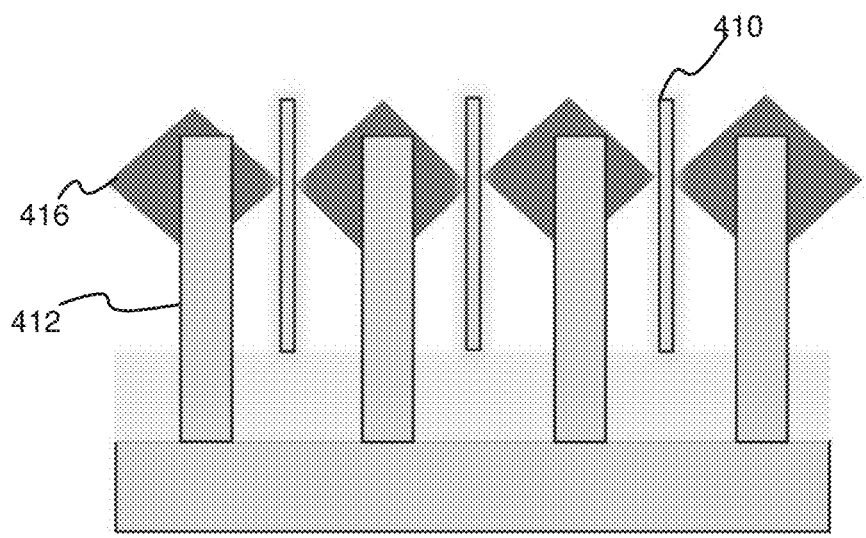
FIG. 4B illustrates a 2D illustration of an exemplified finFET device from a side view in accordance with certain embodiments of the presently disclosed subject matter.

FIG. 4A depicts a 3D illustration of an exemplified finFET device formed on a wafer in accordance with certain embodiments of the presently disclosed subject matter. A fin structure 402 protrudes from a substrate layer and is raised above shallow trench isolation (STI). Gate stack 404 contacts the fin structure 402 on three sides, forming multiple gates. A channel region is defined by the region under gate stack 404 in fin structure 402. Source and drain regions are adjacent the channel region at opposite ends in fin structure 402. Epitaxy 406 is formed on the source and drain region between the gates. FIG. 4B shows a 2D illustration of an exemplified finFET device from a side view in accordance with certain embodiments of the presently disclosed subject matter. A plurality of fins 412 are illustrated, with respective epitaxies 416 formed thereon.

As semiconductor processes progress and the technology is scaled up, the fin density increases in each technology node and the fins get taller. Due to this chip scaling, the epitaxies become closer to each other in each technology node. In advanced technology node such as, e.g., 5 nm and below, in order to avoid short between the epitaxies, high-k (HK) fins 410 can be added which separates the epitaxies from touching each other.

The HK fins refer to fins made of high-K dielectric material with a high dielectric constant (K, kappa), as compared to silicon dioxide. High-K dielectrics are used in semiconductor manufacturing processes to allow further miniaturization of microelectronic components. In some cases, such materials are commonly referred to as high-k materials instead of high-K.

Figure 5:
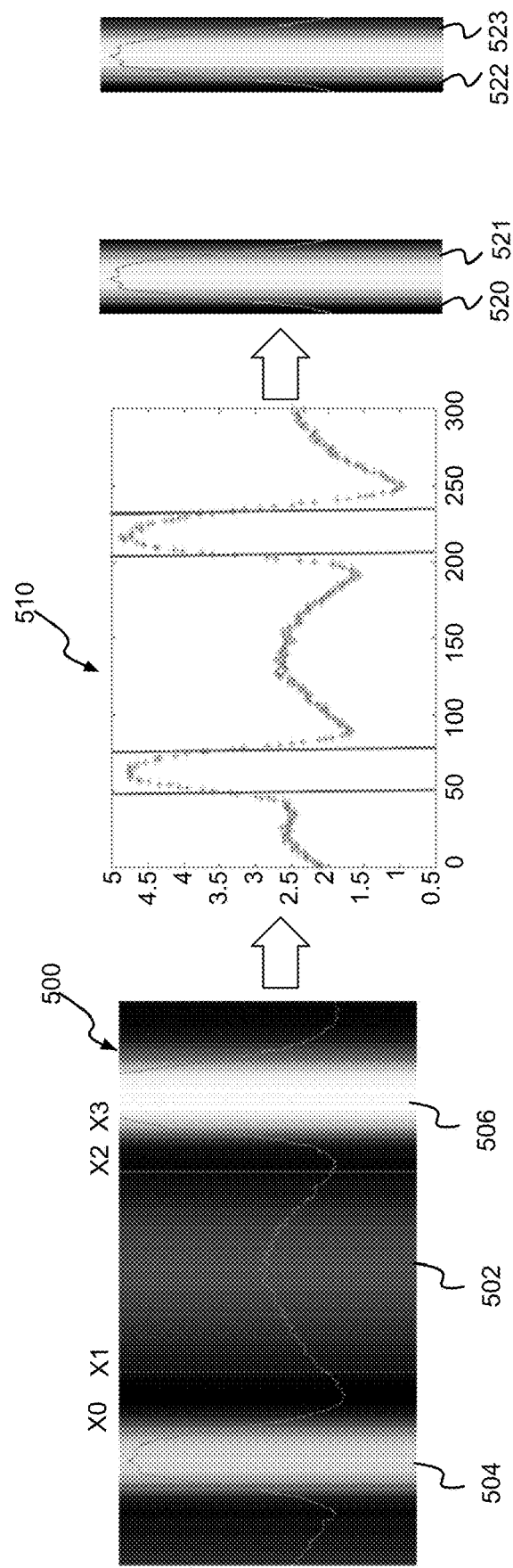
FIG. 5 illustrates an example of detecting edges of the HK fins in an image in accordance with certain embodiments of the presently disclosed subject matter.

However, such additional HK fins pose a challenge for performing metrology operations, such as, e.g., critical dimension (CD) measurement with respect to the epitaxy. FIG. 5 illustrates an exemplified SEM image 500 representative of an epitaxy 502 and two neighboring HK fins 504 and 506. As shown, due to the material difference, the HK fins 504 and 506 present a much higher contrast in the SEM image as compared to the epitaxy 502. Conventional metrology algorithms, that were used to measure CD measurements for epitaxy, rely on edge detection of the epitaxy. However, in images that capture both the epitaxy and the HK fins, such as 500, since the HK fins possess a much higher contrast, the edge detection algorithms will most likely detect the edges of the HK fins instead of the edges of the epitaxy, therefore are not usable for performing epitaxy-related metrology operations.

Certain embodiments of the present disclosure propose a metrology system and method of performing metrology operations for epitaxy in such cases (i.e., the epitaxy being separated with at least one adjacent epitaxy by at least one high-k (HK) fin).

The term "metrology operation" used in this specification should be expansively construed to cover any metrology operation procedure used to extract metrology information relating to one or more structural elements on a semiconductor specimen. By way of example, metrology information to be extracted can be indicative of one or more of the following: dimensions (e.g., line widths, line spacing, contacts diameters, size of the element, edge roughness, gray level statistics, etc.), shapes of elements, distances within or between elements, related angles, overlay information associated with elements corresponding to different design levels, etc. In some embodiments, the metrology operations can include measurement operations, such as, e.g., critical dimension (CD) measurements performed with respect to certain structures, such as, e.g., the epitaxy.

According to certain embodiments, functional modules comprised in PMC 102 can include an edge detection module 104, a measurement module 106, and a correction module 108. The PMC 102 can be configured to obtain, via I/O interface 126, an image representative of an epitaxy and at least one HK fin that separates the epitaxy with at least one adjacent epitaxy, and a gray level (GL) profile indicative of GL distribution of the image. The edge detection module 104 can be configured to detect edges of the at least one HK fin in the image based on the GL profile.

The measurement module 106 can be configured to determine two inflection points of the GL profile within an area of interest in the image at least based on the detected edges of the at least one HK fin, and perform a critical dimension (CD) measurement between the two inflection points. The inflection points are indicative of expected presence of edges of the epitaxy.

The correction module 108 can be configured to determine whether to apply correction to the CD measurement based on a GL ratio indicative of a relative position of the epitaxy with respect to the at least one HK fin, and apply correction to the CD measurement upon the GL ratio meeting a predetermined criterion.

Operations of system 101, PMC 102 and the functional modules therein, will be further detailed with reference to FIGS. 2, 3A and 3B.

According to certain embodiments, system 101 can comprise a storage unit 122. The storage unit 122 can be configured to store any data necessary for operating system 101, e.g., data related to input and output of system 101, as well as intermediate processing results generated by system 101. By way of example, the storage unit 122 can be configured to store the FP images produced by the examination tool 120 and/or derivatives thereof. Accordingly, the one or more FP images can be retrieved from the storage unit 122 and provided to the PMC 102 for further processing.

In some embodiments, system 101 can optionally comprise a computer-based Graphical User Interface (GUI) 124 which is configured to enable user-specified inputs related to system 101. For instance, the user can be presented with a visual representation of the specimen (for example, by a display forming part of GUI 124), including image data of the specimen. The user may be provided, through the GUI, with options of defining certain operation parameters. In some cases, the user may also view operation results, such as the measurement results on the GUI.

As will be further detailed with reference to FIG. 2, system 101 is configured to receive, via I/O interface 126, FP images. FP images can include image data (and/or derivatives thereof) produced by the examination tools 120 and/or image data stored in one or more data depositories. It is noted that in some cases FP images can include image data (e.g., captured images, images derived from the captured images, simulated images, synthetic images, etc.) and associated numeric data (e.g., metadata, hand-crafted attributes, etc.). It is further noted that image data can include data related to a layer of interest and/or to one or more other layers of the specimen.

System 101 is further configured to process the received FP images and send, via I/O interface 126, the results or part thereof (e.g., the CD measurement) to the storage unit 122, and/or the examination tool 120.

In some embodiments, additionally to the examination tool 120, the examination system 100 can comprise one or more examination modules, such as, e.g., defect detection module and/or Automatic Defect Review Module (ADR) and/or Automatic Defect Classification Module (ADC) and/or a metrology-related module and/or other examination modules which are usable for examination of a semiconductor specimen. The one or more examination modules can be implemented as stand-alone computers, or their functionalities (or at least part thereof) can be integrated with the examination tool 120. In some embodiments, the CD measurement as obtained from system 101 can be used by the examination tool 120 and/or the one or more examination modules (or part thereof) for examination of the specimen.

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the examination system illustrated in FIG. 1 can be implemented in a distributed computing environment, in which the aforementioned functional modules as comprised in the PMC 102 can be distributed over several local and/or remote devices, and can be linked through a communication network. It is further noted that in other embodiments at least some of the examination tool(s) 120, storage unit 122 and/or GUI 124 can be external to the examination system 100 and operate in data communication with system 101 via I/O interface 126. System 101 can be implemented as stand-alone computer(s) to be used in conjunction with the examination tools. Alternatively, the respective functions of the system 101 can, at least partly, be integrated with one or more examination tools 120, thereby facilitating and enhancing the functionalities of the examination tools 120 in examination-related processes.

Figure 2:
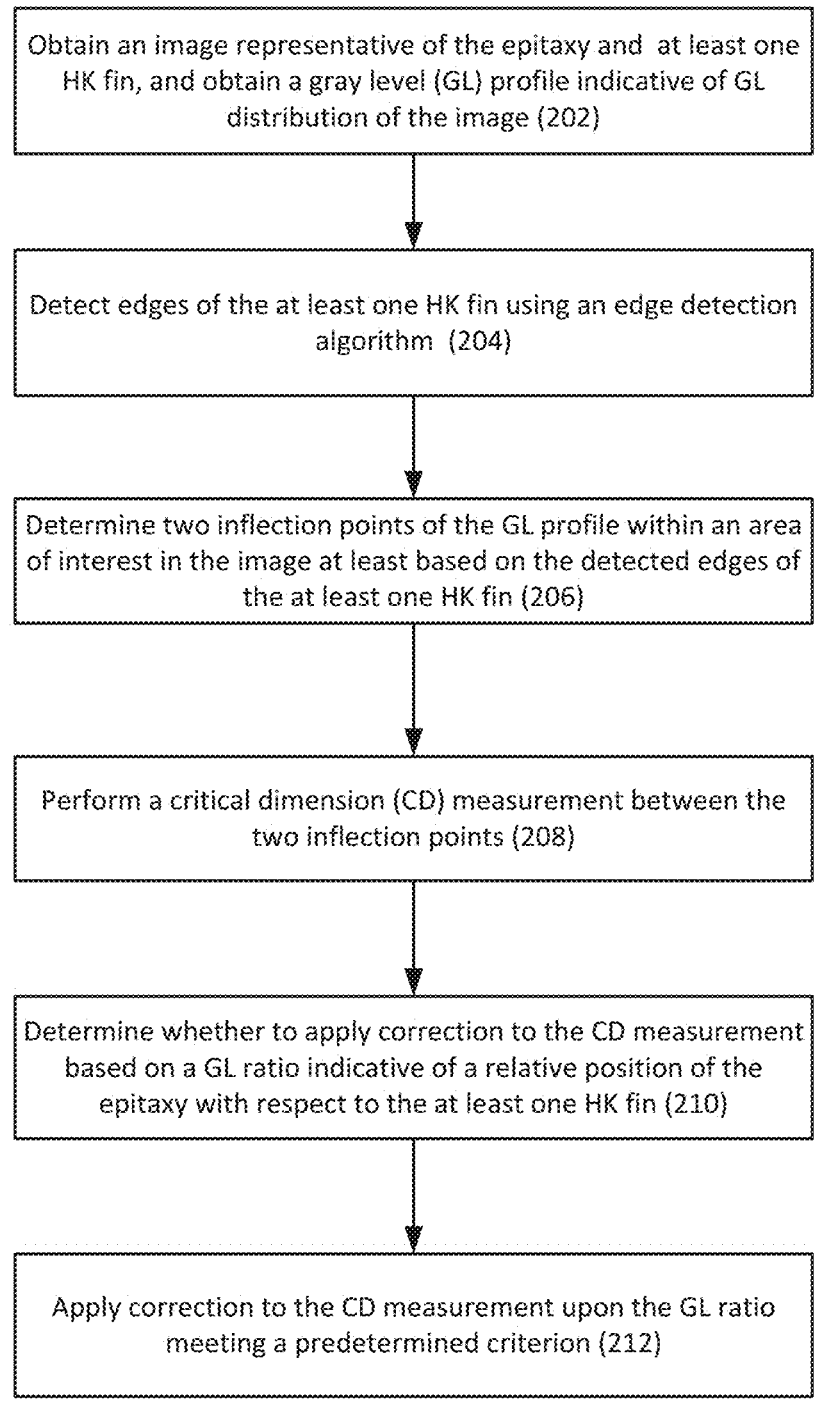
FIG. 2 illustrates a generalized flowchart of performing a measurement with respect to an epitaxy formed in a fin field effect transistor (finFET) in accordance with certain embodiments of the presently disclosed subject matter.

Referring to FIG. 2, there is illustrated a generalized flowchart of performing a measurement with respect to an epitaxy formed in a fin field effect transistor (finFET) in accordance with certain embodiments of the presently disclosed subject matter.

As described above, epitaxies grow on respective fins in the finFET device, acting as stressors and enabling higher channel mobility. In advanced technology nodes, due to the chip scaling, the epitaxies become closer to each other. In order to avoid short between the epitaxies, HK fins can be added which separates neighboring/adjacent epitaxies from touching each other.

According to certain embodiments, during the manufacturing process, an epitaxy may develop differently with respect to the HK fins due to process variations. A given epitaxy can be separated with at least one adjacent epitaxy by at least one HK fin in a finFET device. Process variation can refer to variations caused by a change in the fabrication process of a specimen. By way of example, the fabrication process may cause slight shifting/scaling/distortion of certain structures/patterns which results in pattern variation.

Figure 8:
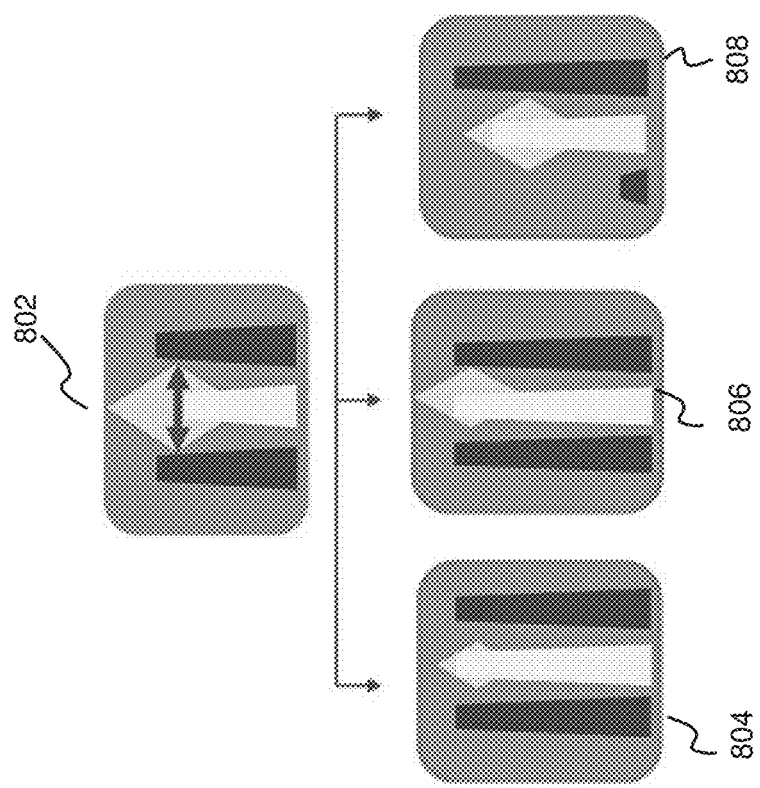
FIG. 8 illustrates schematically examples of different epitaxy developments with respect to neighboring HK fins in accordance with certain embodiments of the presently disclosed subject matter.

FIG. 8 illustrates schematically examples of different epitaxy developments with respect to neighboring HK fins in accordance with certain embodiments of the presently disclosed subject matter. For instance, 802 illustrates an ideal scenario where the epitaxy is fully developed between two HK fins, i.e., the edges of the epitaxy are touching the two HK fins from the two sides. However, due to process variations occurring in the manufacturing process, the epitaxy growth may also vary. For instance, 804 illustrates an example of a non-developed epitaxy, i.e., the epitaxy did not fully grow and is clearly separate from the HK fins. In such cases, the width dimension of the epitaxy is relatively smaller with respect to the distance between the HK fin edges. 806 shows another example where the epitaxy has a preferential growth on one side (e.g., the epitaxy over-grows on the HK fin from one side). For instance, in the present example it appears that the epitaxy has a noticeable slant to the right side, whereas in 808, there is a missing HK fin on the left side of the epitaxy, therefore only one HK fin is present on the right side. This is also referred to below as a fin-less scenario. In the scenarios of 802, 804 and 806, the epitaxy is separated with two adjacent epitaxies (not illustrated in the figure) by two HK fins from both sides, while in the fin-less scenario of 808, the epitaxy is separated with one adjacent epitaxy (e.g., the one from the right side) by one HK fin.

For performing measurement with respect to the epitaxy, an image representative of the epitaxy and the at least one HK fin can be obtained (202) (e.g., by the PMC 102 via I/O interface 126). The image can be a FP image captured by an examination tool. By way of example, the image can be captured by a low-resolution examination tool (e.g., an optical inspection system, low-resolution SEM, etc.). Alternatively, the image can be captured by a high-resolution examination tool (e.g., high-resolution SEM, AFM, TEM, etc.). In some embodiments, the image can be a SEM image captured by a SEM tool. By way of example, the SEM tool can be critical dimension scanning electron microscopes (CD-SEM) used to measure critical dimensions of structural features in the image.

A gray level (GL) profile indicative of GL distribution of the image can be also obtained (202). By way of example, the gray level profile can be represented in the form of a waveform signal. For instance, the signal can represent the GL of a sequence of pixels from the image that are taken along a direction that is normal to the main direction of the pattern. In some cases, the GL profile can be generated and stored in advance, and can be obtained by the PMC 102 via I/O interface 126, together or separately with the image. In some other cases, the GL profile can be generated by the PMC 102 based on the image.

Edges of the at least one HK fin can be detected (204) (e.g., by the edge detection module 104) on the image based on the GL profile. As described above, due to material difference, the HK fins present a much higher contrast in the SEM image as compared to the epitaxy. Different edge detection algorithms can be used for detecting the HK fin edges and the present disclosure is not limited by specific algorithms used for this purpose. By way of example, the edges of the HK fin can be detected using an edge detection algorithm selected from a group comprising advanced line analysis, Sobel, Canny, Prewitt, Roberts, and fuzzy logic methods.

According to certain embodiments, the edge detection algorithm can be selected as the advanced/optimized line analysis algorithm. The algorithm is based on physical properties of the SEM signal and is designed to cope with advanced technology nodes with relatively shrunken CD measurements, such as, e.g., CD below 10-15 nm. Due to the physical properties of the SEM signal, when the electron beam is much narrower than the width of the scanned lines, the interaction volume size created is such that each line is represented by two clear edges (e.g., two clear peaks in the signal), which is used by the Line Edge Analysis (LEA) algorithm in order to detect edges and measure CD. However, in advanced technology nodes, the dimensions of the features are further shrunken, and the electron beam is no longer much narrower than the width of the scanned lines. For instance, in lines whose CD is smaller than 10-15 nm, the two edge peaks are merged into one. In such cases, the advanced line analysis algorithm can be used to define the region of interest for CD measurement based on the maximum slope (e.g., the place with the maximum gradient) of the signal (e.g., from both sides of the signal peak), or based on a user-defined threshold. The CD is measured between the two points representative of the maximum slope, or between the user defined threshold.

According to certain embodiments, the edge detection algorithm can be implemented using an edge detection method as described in U.S. Pat. No. 9,165,376 titled "SYSTEM, METHOD AND COMPUTER READABLE MEDIUM FOR DETECTING EDGES OF A PATTERN", which is incorporated herein by reference in its entirety. For instance, the image can be processed to provide an edge enhanced image, and edges of a pattern can be found by detecting paths in the edge enhanced image, for which details are described therein, e.g., with reference to FIG. 11 of the incorporated U.S. Pat. No. 9,165,376.

Turning now to FIG. 5, there is illustrated an example of detecting edges of the HK fins in an image in accordance with certain embodiments of the presently disclosed subject matter.

An exemplified SEM image 500 representative of an epitaxy 502 and two neighboring HK fins 504 and 506 is illustrated. As can be seen, due to the material difference, the HK fins 504 and 506 present a much higher contrast in the SEM image as compared to the epitaxy 502, i.e., the HK fins are much brighter in gray level relative to the epitaxy. The gray level profile 510 of the SEM image 500 is generated and represented in the form of a waveform signal. The signal can represent the gray level of a sequence of pixels along a direction that is normal/perpendicular to the longitudinal axis of the HK fins. Using an edge detection algorithm, such as the advanced line analysis algorithm described above, two edges 520 and 521 of the HK fin 504 and two edges 522 and 523 of the HK fin 506 are detected.

Continuing with the description of FIG. 2, two inflection points of the GL profile within an area of interest in the image can be determined (206) (e.g., by the measurement module 106 of PMC 102) at least based on the detected edges of the at least one HK fin. The inflection points are indicative of expected presence of edges of the epitaxy.

According to certain embodiments, the number of HK fins comprised in the at least one HK fin can be determined based on the detected edges, i.e., how many HK fins are present in the image (e.g., two HK fins, or one HK fin is missing). An area of interest used herein refers to the area in the image containing the epitaxy, and can be extracted and used for identifying the inflection points and performing the measurements with respect to the epitaxy. The area of interest is also referred to as the epitaxy area. The area of interest can be identified based on the determined number of HK fins and the detected edges.

Referring now to FIGS. 3A and 3B, there are illustrated generalized flowcharts of determining the area of interest and the inflection points of the GL profile in different scenarios in accordance with certain embodiments of the presently disclosed subject matter.

Figure 6:
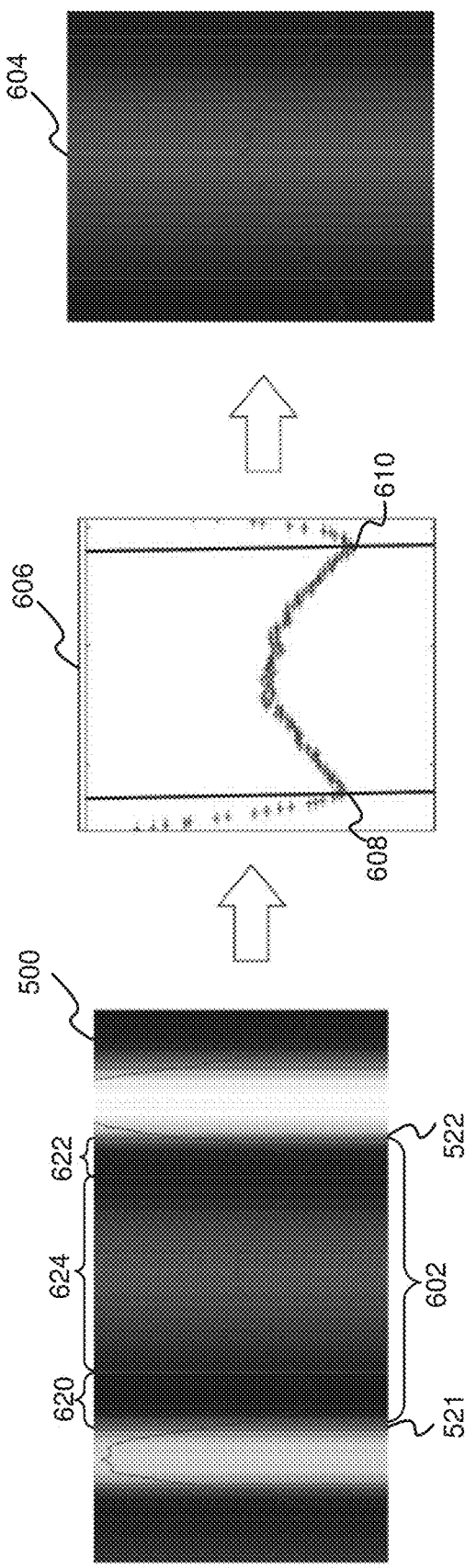
FIG. 6 illustrates an example of identifying an area of interest and determining inflection points in the exemplified SEM image 500 in accordance with certain embodiments of the presently disclosed subject matter.

In some embodiments, it can be determined (302), based on the detected edges of the at least one HK fin, that the at least one HK fin comprises two HK fins respectively separating the epitaxy with two adjacent epitaxies, as illustrated in FIG. 3A. For instance, it can be determined there are two HK fins if four well-defined fin edges are detected. In such cases, the area of interest can be identified (304) to be the area between the inner edges (i.e., the edges that are closer to the epitaxy) of the two HK fins. The two inflection points of the GL profile within the area of interest as identified can then be determined (206). FIG. 6 shows an example of such cases.

FIG. 6 continues with the exemplified SEM image 500 where there is an epitaxy 502 surrounded by two neighboring HK fins 504 and 506 separating the epitaxy 502 with two adjacent epitaxies. Upon detecting the edges 520, 521, 522 and 523 of the HK fins, as illustrated in FIG. 5, the area of interest 602 is identified as the area between the inner edges 521 and 522 (i.e., the right edge of the left HK fin, and the left edge of the right HK fin) of the HK fins. Optionally, the area of interest 602 can be cropped off as a separate image 604 with a corresponding GL profile 606 for purpose of further processing.

Specifically, two inflection points 608 and 610 of the GL profile in the area of interest 602 can be identified. An inflection point of a graph or signal refers to a point at which the curvature changes sign, i.e., where the signal or graph changes from being concave (concave downward) to convex (concave upward), or vice versa. The inflection points of the GL profile can be determined using various methods. By way of example, the two inflection points can be determined using an edge enhancement algorithm. For instance, the inflection points can be determined based on the secondary derivative of the GL profile signal. In another example, the inflection points can be determined based on the second order Legendre polynomial function.

In some other embodiments, it can be determined (310), based on the detected edges of the at least one HK fin, that the at least one HK fin comprises a single HK fin separating the epitaxy with an adjacent epitaxy (i.e., there is a missing HK fin on one side of the epitaxy). This is typically referred to as the fin-less scenario when there are less than four well-defined fin edges detected. For instance, the fin-less scenario can be detected if the fin CD is not within a predefined range. In such cases, according to certain embodiments, the process of identifying the area of interest and inflection points can be performed as follows: determining (312) a first inflection point of the GL profile on a fin-less side of the epitaxy (i.e., the side where the HK fin is missing), identifying (314) the area of interest to be the area between the first inflection point and one of the edges of the single HK fin, and determining (316) a second inflection point of the GL profile within the area of interest.

Once the two inflection points are determined, a critical dimension (CD) measurement can be performed (208) (e.g., by the measurement module 106) between the two inflection points. For instance, in the example of FIG. 6, the CD measurement is performed by measuring the distance between the inflection points 608 and 610. The CD measurement obtained in this case is indicative of the width of the epitaxy.

It is to be noted that although the width is used as an example of a CD measurement, this should not be regarded as limiting the present disclosure in any way. Other suitable critical dimensions (CD) of the epitaxy can be applied in addition to or in lieu of the above.

Upon obtaining the CD measurement, it is needed to determine (210) (e.g., by the correction module 108) whether to apply correction to the CD measurement based on a GL ratio indicative of a relative position of the epitaxy with respect to the at least one HK fin.

As described above with reference to FIG. 8, due to process variations, an epitaxy may develop differently with respect to the neighboring HK fin(s) during the manufacturing process, as exemplified in the scenarios of 802, 804, 806 and 808. As can be seen, the relative position between the epitaxy and the neighboring HK fin(s) are different in respective scenarios.

By way of example, in the non-developed epitaxy scenario in 804, the epitaxy is clearly separated from the HK fins from both sides. SEM image 500 shows an example of an image representative of such cases. The inflection points obtained in such cases correspond to the lowest points of the GL profile in the area of interest, which represent the edges of the epitaxy. Therefore, the CD measurement between the two inflection points in such cases reflect the width of the epitaxy and does not require correction. By way of another example, in the fully developed epitaxy scenario in 802, the epitaxy is touching the HK fins from both sides. In other words, the epitaxy is full between the two HK fins. The inflection points obtained in such cases correspond to the inner edges of the HK fins. The CD measurement between the two inflection points in such cases reflect the distance between the HK fins, therefore does not require correction.

By way of another example, in the scenario 806 where the epitaxy has a preferential growth on one side, the epitaxy is separated from the HK fin from one side, and may over grow on the HK fin from the other side. In such cases, the GL profile on the side of the preferential growth is usually noisy and does not have well-defined minima (as exemplified in image 704 of FIG. 7), thus causing errors or variances when identifying the inflection point on the side of the preferential growth, and the CD measurement obtained in such cases therefore requires correction.

According to certain embodiments, a GL ratio can be used to indicate the relative position of the epitaxy with respect to the HK fins. By way of example, the GL ratio can be determined based on a first GL value determined based on one or more pixel values between edges of the at least one HK fin and the epitaxy, and a second GL value determined based on one or more pixel values between the two inflection points.

By way of example, in cases where the epitaxy is surrounded by two adjacent HK fins from two sides, the at least one HK fin can comprise a first HK fin and a second HK fin respectively separating the epitaxy with a first adjacent epitaxy and a second adjacent epitaxy, such as exemplified in the SEM image 500. The GL ratio in such cases can be determined based on an averaged GL value averaged between a first GL value and a second GL value, and a third GL value. The first GL value can be determined based on one or more pixel values between edges of the first HK fin and the first adjacent epitaxy. The second GL value can be determined based on one or more pixel values between edges of the second HK fin and the second adjacent epitaxy. The third GL value can be determined based on one or more pixel values between the two inflection points.

For instance, as illustrated in FIG. 6, the first GL value can be determined based on the pixel values in the range 620, i.e., between the right edge of the left HK fin and the left edge of the epitaxy (as represented by the inflection point 608). For example, the first GL value can be an averaged GL value of the pixels in the range, or a minimum GL value of the pixels. The second GL value can be determined based on the pixel values in the range 622, i.e., between the right edge of the epitaxy (as represented by the inflection point 610) and the left edge of the right HK fin. For example, the second GL value can be an averaged GL value of the pixels in the range, or a minimum GL value of the pixels. An averaged GL value can be calculated based on the first GL value and the second GL value. The third GL value can be determined based on the pixel values in the range of 624, i.e., between the edges of the epitaxy (as represented by the two inflection points 608 and 610). The GL ratio can be calculated as a ratio between the averaged GL value and the third GL value.

When the GL ratio, as calculated above, is smaller than a first threshold (e.g., a lower threshold), it means that there is a clear separation between the epitaxy and the at least one HK fin, thus indicating that the epitaxy is not fully developed. Therefore, no correction is required. When the GL ratio is larger than a second threshold (e.g., a higher threshold), this means that the epitaxy is touching the HK fins, thus indicating the epitaxy is fully developed between the HK fins. In such cases, the CD measurement should correspond to the distance between the two HK fins, thus there is also no need for correction, as described above. When the GL ratio falls between the first threshold and the second threshold, indicating there is a preferential growth of the epitaxy on one side, correction should be applied to the CD measurement.

Therefore, when determining whether to apply correction to the CD measurement, the GL ratio as described above should be calculated, and correction should be applied to the CD measurement upon the GL ratio meeting a predetermined criterion. The predetermined criterion comprises that the GL ratio is within a range defined by a first threshold and a second threshold, indicating that the epitaxy has preferential growth on one side with respect to the other side.

In some embodiments, the GL ratio as described above can be recognized as actually comprising two GL ratios (instead of averaging them out to an averaged GL ratio): a first ratio between the first GL value and the third GL value (also referred to as the left GL ratio, as exemplified in the example of FIG. 6), and the second ratio between the second GL value and the third GL value (also referred to as the right GL ratio, as exemplified in the example of FIG. 6). The determination of whether to apply correction to the CD measurement can be based on either the two GL ratios, or the averaged GL ratio. The present disclosure should not be limited by the number of GL ratios used, or how, specifically, the ratios are obtained.

According to certain embodiments, the correction (i.e., the amount of correction to apply on the CD measurement) can be based on an offset parameter and the GL ratio. In one example, the amount of correction can be the product of the offset parameter and the GL ratio. For instance, the corrected CD=measured CD+offset*GL ratio.

In some embodiments, specifically, correction can be applied separately to the location of the left and right edges of the epitaxy. For instance, take the SEM image 500 in FIG. 5 as an example, assuming the coordinates of edge location in the image are as follows (as marked in the FIG. 5):

Right edge of left fin: $X_0=0$;
Left edge of epitaxy (EPI): $X_1=X_0+EWL$ (width between right edge of left fin and left edge of EPI);
Right edge of EPI: $X_2=X_1+EPI$ (width of epitaxy);
Left edge of right fin: $X_3=X_2+EWR$ (width between right edge of EPI and left edge of right fin);

Correction of the location of the left edge and right edge of epitaxy can be defined using a correction function $f$ over the GL ratio:

$$X_1^{new} = X_1 - f(r1) * CD_{offset}$$

$$X_2^{new} = X_2 + f(r2) * CD_{offset}$$

where r1 represents the left GL ratio, i.e., the ratio between the first GL value which can be determined based on the pixel values between the right edge of the left HK fin and the left edge of the epitaxy, and the third GL value determined based on the pixel values between the edges of the epitaxy; and r2 represents the right GL ratio, i.e., the ratio between the second GL value which can be determined based on the pixel values between the right edge of the epitaxy and the left edge of the right HK fin, and the third GL value determined based on the pixel values between the edges of the epitaxy. $X_1^{new}$ represents the corrected position of $X_1$, and $X_2^{new}$ represents the corrected position of $X_2$.

The correction to the CD measurement can be estimated as: CD correction=$(X_2^{new} - X_1^{new}) = (X_2 - X_1) = (f(r1) + f(r2)) * CD_{offset}$.

Figure 7:
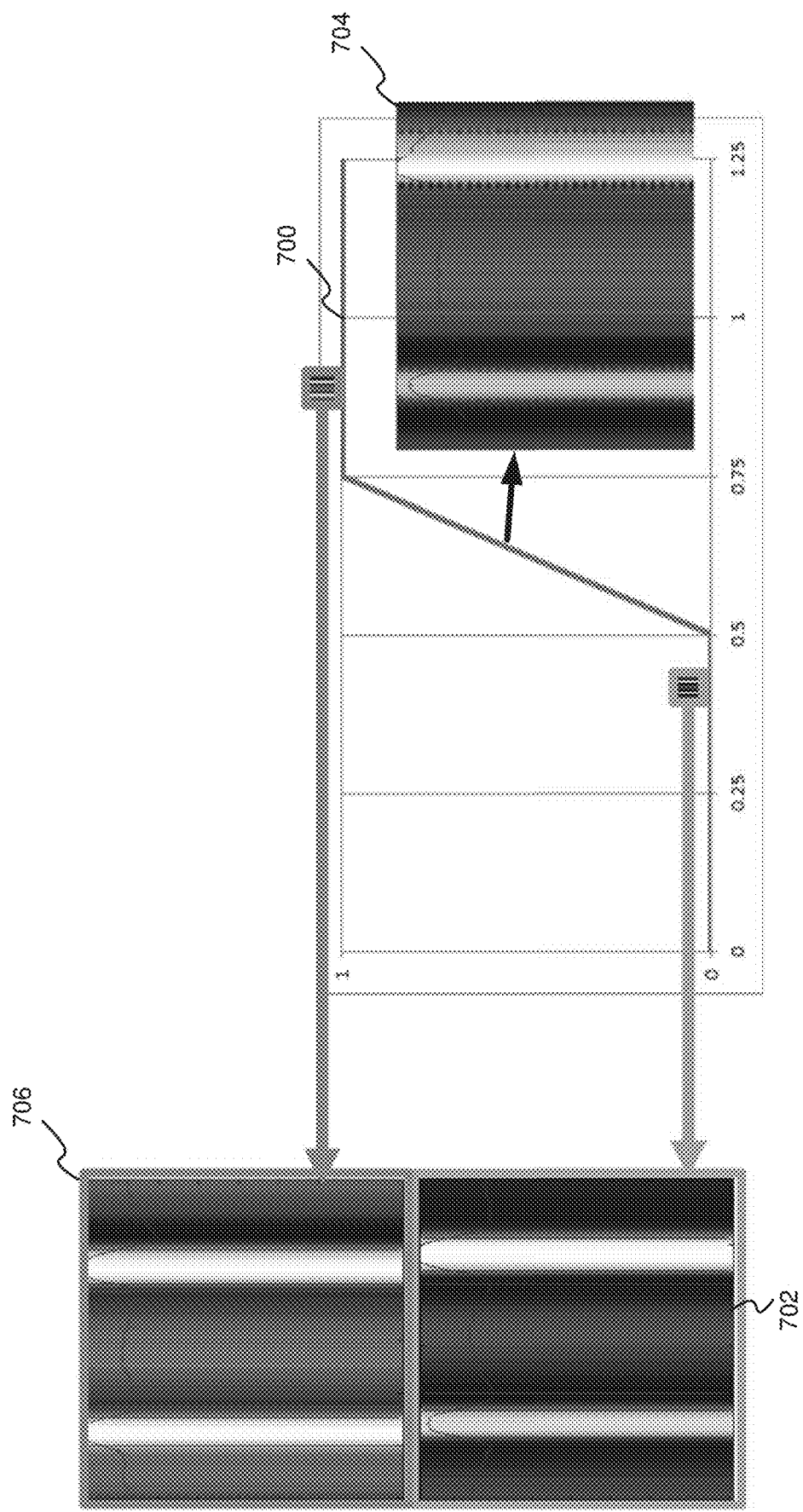
FIG. 7 illustrates an example of a correction function in accordance with certain embodiments of the presently disclosed subject matter.

FIG. 7 illustrates an example of a correction function in accordance with certain embodiments of the presently disclosed subject matter.

As shown in FIG. 7, the correction function 700 is exemplified as a linear ramp function. The X axis represents the GL ratio, and the Y axis represents the correction. In the present implementation example, the correction is applied separately to the location of the left and right edge of the epitaxy (represented by the inflection points as identified). Specifically, when the GL ratio of a given side (the left GL ratio or the right GL ratio) is smaller than a first threshold (exemplified as 0.5 in the example), indicating a non-developed epitaxy on the given side, thus no correction is required to apply to the location of the epitaxy edge on the given side. In the example of SEM image 702, the left GL ratio and the right GL ratio are both smaller than the first threshold, indicating that the epitaxy is not developed on both sides. Therefore, no correction is needed in either side.

When the GL ratio is within a range between a first threshold (exemplified as 0.5 in the example) and a second threshold (exemplified as 0.75 in the example), indicating a preferential epitaxy growth on the given side, the correction can be applied to the location of the epitaxy edge in accordance with the linear ramp function. In the example of SEM image 704, the left GL ratio is smaller than the first threshold, while the right GL ratio is within the range between the first threshold and the second threshold, indicating that the epitaxy has a preferential growth on the right side. Therefore, correction can be applied to the location of the right edge of the epitaxy using the linear ramp function. For instance, the corrected location of the right edge would be: $X_2^{new} = X_2 + f(r2) * CD_{offset}$.

When the GL ratio is larger than the second threshold, this indicates that the epitaxy is full and touching the fin on the given side. In the present example it appears that there is a constant correction applied for the location of the epitaxy edges on both sides in such cases. However, to ensure that the corrected CD measurement is not greater than the distance between the two HK fins, an additional limitation is applied, i.e., the corrected edge of the epitaxy should be limited by the location of the HK fin edge. Therefore, $X_2^{new}=\min(\text{corrected } X_2, X_3)$, $X_1^{new}=\max(\text{corrected } X_1, X_0)$. This means that the corrected location of the right edge of the epitaxy is limited by the right HK edge, and the corrected location of the left edge of the epitaxy is limited by the left HK edge. The corrected CD measurement (i.e., $X_2^{new} - X_1^{new}$) should be approximately equal to the distance between the two HK fins.

It is to be noted that although FIG. 7 illustrates a linear ramp function as an example of the correction function, this is for exemplary purposes only and is not intended to limit the present disclosed subject matter in any way. Any other suitable function, such as, e.g., quadratic function, or polynomial function, etc., can be used in lieu of the exemplified function above.

In some embodiments, the offset parameter $CD_{offset}$ can be predetermined according to an offset between corresponding TEM measurements and SEM measurements of a reference epitaxy formed on a reference finFET. The first threshold and the second threshold can also be predetermined based on the TEM measurements and SEM measurements. By way of example, the first threshold and the second threshold are predetermined according to a correlation parameter indicative of a correlation level between the corresponding TEM measurements and SEM measurements of the reference epitaxy.

Figure 9:
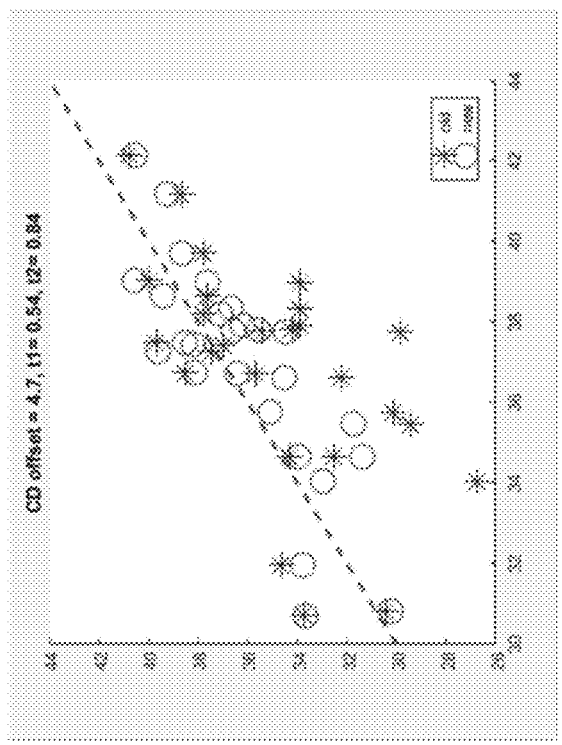
FIG. 9 shows a plot illustrating the SEM vs. TEM correlation in accordance with certain embodiments of the presently disclosed subject matter.

According to certain embodiments, the three parameters: the first threshold, the second threshold, and the offset, can be automatically determined using a utility developed for CD measurement correction. The utility can receive a training set including SEM images (and/or SEM measurements) of a reference epitaxy and corresponding TEM data, and, through optimization, it produces an optimal set of parameters usable for CD measurement correction based on the correlation between the SEM and TEM measurements. FIG. 9 shows a plot run by the utility illustrating the SEM vs. TEM correlation in accordance with certain embodiments of the presently disclosed subject matter. As shown, Y axis of the plot represents a set of SEM measurements and X axis represents corresponding TEM measurements. The utility can estimate the correlation between the corresponding measurements. By way of example, a linear regression function y=a*x+b with a correlation coefficient $R^2$ can be derived based on the correlation. In some cases, the offset b in the function can be used as the offset parameter (denoted as CD offset in the figure) in the CD correction function. The first and second thresholds (denoted as t1 and t2 in the figure) can be derived based on the correlation coefficient $R^2$.

According to certain embodiments, the metrology process as described above with reference to FIG. 2 can be included as part of a metrology recipe usable by system 101 and/or the examination tools 120 for performing metrology operations in runtime. In such cases, the presently disclosed subject matter also includes a system and method for generating a metrology recipe during a recipe setup phase, where the recipe comprises the steps as described with reference to FIG. 2 (and various embodiments thereof). It is to be noted that the term "metrology recipe" should be expansively construed to cover any recipe that can be used by an examination tool (or more specifically, a metrology tool) for performing metrology operations during a runtime measurement phase.

It is to be noted that, although in some embodiments of the presently disclosed subject matter, it is described that correction is applied upon the GL ratio meets a predetermined criterion, this does not necessarily mean correction cannot be applied to the CD measurement when the GL ratio does not meet this criterion. By way of example, in some embodiments, when the predetermined criterion is that the GL ratio is within the range between the first and second thresholds, correction can be applied as exemplified above when GL ratio indeed falls within this range. However, in such embodiments, it can be still determined (either automatically or manually) that certain correction (e.g., for minor adjustment) can be applied to the CD measurement when the GL ratio does not fall within this range. As a matter of fact, in some cases, it is possible that different correction can be applied in different scenarios (e.g., the scenarios can include: the GL ratio is smaller than the first threshold, and/or within the range, and/or larger than the second threshold). The present disclosure is not limited to a specific predetermined criterion, a specific correction applied thereto, or whether any correction is applied when the predetermined criterion is not met.

It is to be noted that examples illustrated in the present disclosure, such as, e.g., SEM images illustrating different scenarios, the edge detection algorithms, and the inflection point identification methods as described above, etc., are illustrated for exemplary purposes, and should not be regarded as limiting the present disclosure in any way. Other examples can be used in addition to or in lieu of the above.

Among advantages of certain embodiments of the epitaxy metrology process as described herein is to provide robust CD measurements for the specific epitaxy structure (where the epitaxy is separated with one or more neighboring epitaxies by one or more HK fins) in the advanced technology nodes. The measurements obtained using the described metrology process possess improved precision level and have high correlation with TEM measurements. The metrology solution has proved to be sustainable for advanced technology nodes, such as, e.g., nodes below 5 nm.

It is to be understood that the present disclosure is not limited in its application to the details set forth in the description contained herein or illustrated in the drawings.

It will also be understood that the system according to the present disclosure may be, at least partly, implemented on a suitably programmed computer. Likewise, the present disclosure contemplates a computer program being readable by a computer for executing the method of the present disclosure. The present disclosure further contemplates a non-transitory computer-readable memory tangibly embodying a program of instructions executable by the computer for executing the method of the present disclosure.

The present disclosure is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the present disclosure as hereinbefore described without departing from its scope, defined in and by the appended claims.

The invention claimed is:

1. A computerized system of performing a measurement with respect to an epitaxy formed in a fin field effect transistor (finFET), the epitaxy being separated with at least one adjacent epitaxy by at least one high-k (HK) fin, the system comprising a processing and memory circuitry (PMC) configured to:
   obtain an image representative of the epitaxy and the at least one HK fin, and a gray level (GL) profile indicative of GL distribution of the image;
   detect edges of the at least one HK fin on the image based on the GL profile;
   determine two inflection points of the GL profile within an area of interest in the image at least based on the detected edges of the at least one HK fin, the inflection points being indicative of expected presence of edges of the epitaxy;
   perform a critical dimension (CD) measurement between the two inflection points;
   determine whether to apply correction to the CD measurement based on a GL ratio indicative of a relative position of the epitaxy with respect to the at least one HK fin; and
   apply correction to the CD measurement upon the GL ratio meeting a predetermined criterion.

2. The computerized system according to claim 1, wherein the PMC is further configured to determine the number of HK fins comprised in the at least one HK fin based on the detected edges, and wherein the area of interest is identified based on the determined number of HK fins and the detected edges.

3. The computerized system according to claim 2, wherein the at least one HK fin comprises two HK fins respectively separating the epitaxy with two adjacent epitaxies, and the area of interest is identified to be an area between inner edges of the two HK fins.

4. The computerized system according to claim 2, wherein the at least one HK fin comprises a single HK fin separating the epitaxy with an adjacent epitaxy, and the determining two inflection points comprises determining a first inflection point of the GL profile on a fin-less side of the epitaxy, identifying the area of interest to be an area between the first inflection point and one of the edges of the single HK fin, and determining a second inflection point of the GL profile within the area of interest.

5. The computerized system according to claim 1, wherein the GL ratio is determined based on a first GL value determined based on one or more pixel values between edges of the at least one HK fin and the epitaxy, and a second GL value determined based on one or more pixel values between the two inflection points.

6. The computerized system according to claim 1, wherein the at least one HK fin comprises a first HK fin and a second HK fin respectively separating the epitaxy with a first adjacent epitaxy and a second adjacent epitaxy, and the GL ratio is determined based on an averaged GL value averaged between a first GL value and a second GL value, and a third GL value, wherein the first GL value is determined based on one or more pixels values between edges of the first HK fin and the first adjacent epitaxy, the second GL value is determined based on one or more pixel values between edges of the second HK fin and the second adjacent epitaxy, and the third GL value is determined based on one or more pixel values between the two inflection points.

7. The computerized system according to claim 1, wherein the predetermined criterion requires that the GL ratio be within a range defined by a first threshold and a second threshold, indicating the epitaxy has preferential growth on one side with respect to the other side.

8. The computerized system according to claim 7, wherein the first threshold and the second threshold are predetermined according to a correlation parameter indicative of a correlation level between corresponding Transmission Electron Microscope (TEM) measurements and Scanning Electron Microscope (SEM) measurements of a reference epitaxy of a reference finFET specimen.

9. The computerized system according to claim 1, wherein the correction is based on an offset parameter predetermined according to an offset between corresponding TEM measurements and SEM measurements of a reference epitaxy of a reference finFET specimen.

10. The computerized system according to claim 1, wherein the edges of the at least one HK fin are detected using an edge detection algorithm selected from a group comprising advanced line analysis, Sobel, Canny, Prewitt, Roberts, and fuzzy logic methods.

11. The computerized system according to claim 1, wherein the two inflection points are determined using an edge enhancement algorithm.

12. The computerized system according to claim 1, wherein the CD measurement is informative of width of the epitaxy.

13. A computerized method of performing a measurement with respect to an epitaxy formed in a fin field effect transistor (finFET), the epitaxy being separated with at least one adjacent epitaxy by at least one high-k (HK) fin, the method performed by a processing and memory circuitry (PMC), the method comprising:
    obtaining an image representative of the epitaxy and the at least one HK fin, and a gray level (GL) profile indicative of GL distribution of the image;
    detecting edges of the at least one HK fin on the image based on the GL profile;
    determining two inflection points of the GL profile within an area of interest in the image at least based on the detected edges of the at least one HK fin, the inflection points being indicative of expected presence of edges of the epitaxy;
    performing a critical dimension (CD) measurement between the two inflection points;
    determining whether to apply correction to the CD measurement based on a GL ratio indicative of a relative position of the epitaxy with respect to the at least one HK fin; and
    applying correction to the CD measurement upon the GL ratio meeting a predetermined criterion.

14. The computerized method according to claim 13, further comprising determining the number of HK fins comprised in the at least one HK fin based on the detected edges, wherein the area of interest is identified based on the determined number of HK fins and the detected edges.

15. The computerized method according to claim 14, wherein the at least one HK fin comprises two HK fins respectively separating the epitaxy with two adjacent epitaxies, and the area of interest is identified to be an area between inner edges of the two HK fins.

16. The computerized method according to claim 14, wherein the at least one HK fin comprises a single HK fin separating the epitaxy with an adjacent epitaxy, and the determining two inflection points comprises determining a first inflection point of the GL profile on a fin-less side of the epitaxy, identifying the area of interest to be an area between the first inflection point and one of the edges of the single HK fin, and determining a second inflection point of the GL profile within the area of interest.

17. The computerized method according to claim 13, wherein the GL ratio is determined based on a first GL value determined based on one or more pixel values between edges of the at least one HK fin and the epitaxy, and a second GL value determined based on one or more pixel values between the two inflection points.

18. The computerized method according to claim 13, wherein the predetermined criterion comprises that the GL ratio is within a range defined by a first threshold and a second threshold, indicating that the epitaxy has preferential growth on one side with respect to the other side.

19. The computerized method according to claim 13, wherein the correction is based on an offset parameter predetermined according to an offset between corresponding Transmission Electron Microscope (TEM) measurements and Scanning Electron Microscope (SEM) measurements of a reference epitaxy of a reference finFET specimen.

20. A non-transitory computer readable storage medium tangibly embodying a program of instructions that, when executed by a computer, cause the computer to perform a method of performing a measurement with respect to an epitaxy formed in a fin field effect transistor (finFET), the epitaxy being separated with at least one adjacent epitaxy by at least one high-k (HK) fin, the method comprising:
    obtaining an image representative of the epitaxy and the at least one HK fin, and a gray level (GL) profile indicative of GL distribution of the image;
    detecting edges of the at least one HK fin on the image based on the GL profile;
    determining two inflection points of the GL profile within an area of interest in the image at least based on the detected edges of the at least one HK fin, the inflection points being indicative of expected presence of edges of the epitaxy;
    performing a critical dimension (CD) measurement between the two inflection points;
    determining whether to apply correction to the CD measurement based on a GL ratio indicative of a relative position of the epitaxy with respect to the at least one HK fin; and
    applying correction to the CD measurement upon the GL ratio meeting a predetermined criterion.

* * * * *